(12) United States Patent
Delage et al.

(10) Patent No.: US 9,705,499 B1
(45) Date of Patent: Jul. 11, 2017

(54) SYSTEM AND METHOD FOR INTERCHANGEABLE TRANSMISSION DRIVER OUTPUT STAGE AND LOW-POWER MARGINING MODE

(71) Applicant: Cadence Design Systems, Inc., San Jose, CA (US)

(72) Inventors: Jean-Francois Delage, Montreal (CA); Philippe Salib, Laval (CA); Guillaume Fortin, Montreal (CA)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 15/356,395

(22) Filed: Nov. 18, 2016

(51) Int. Cl.
*H03K 17/16* (2006.01)
*H03K 19/003* (2006.01)
*H03K 19/00* (2006.01)
*H03K 19/0175* (2006.01)
*H03K 17/687* (2006.01)

(52) U.S. Cl.
CPC ..... *H03K 19/0016* (2013.01); *H03K 17/6872* (2013.01); *H03K 19/0005* (2013.01); *H03K 19/017509* (2013.01)

(58) Field of Classification Search
None
See application file for complete search history.

(56) References Cited

U.S. PATENT DOCUMENTS

| 7,501,851 | B2 | 3/2009 | Venditti et al. | |
| 9,054,578 | B2 * | 6/2015 | Hsieh | H02M 1/088 |
| 9,590,610 | B2 * | 3/2017 | Luo | H03K 17/10 |
| 2007/0285120 | A1 * | 12/2007 | Venditti | H03K 19/017581 |
| | | | | 326/30 |

* cited by examiner

*Primary Examiner* — Anh Tran
(74) *Attorney, Agent, or Firm* — Andrews Kurth Kenyon LLP

(57) ABSTRACT

A system, method, and circuits for power efficient margining in a differential output driver that includes segments connected to outputs of the driver. Each segment can be configured independently to different states by activating corresponding transistor combinations. In a transmitting state, the transistors transmit data by establishing current paths between the driver outputs and a positive supply rail or a ground rail. In a margining state, the transistors are statically configured to form current paths that differ from those of the transmitting state, such that the segment contributes substantially a same differential impedance between the driver outputs as would be contributed by the segment when in the transmitting state, while contributing a different common mode impedance than in the transmitting state. The current paths of the margining state extend through transistors that transmit data in the transmitting state.

20 Claims, 15 Drawing Sheets

FIG. 5

Control Table 500

| | | | Decoded Controls — Segment Pin Names 524 | | | | | | | | | | | |
|---|---|---|---|---|---|---|---|---|---|---|---|---|---|---|
| 502 State | | EN_MAIN | EN_DEEM | pd_pun_pmos_main_P | pd_pun_nmos_main_P | pd_pun_pmos_deemph_P | pd_pun_nmos_deemph_P | pd_pun_pmos_deemph_M | pd_pun_nmos_deemph_M | pd_pun_pmos_main_M | pd_pun_nmos_main_M | VddPun | VssPd | ResPD | ResPun |
| 504 | Main Driver | 1 | 0 | X | X | 0 | 1 | 0 | 1 | X | X | 0 | 1 | 0 | 1 |
| 506 | Deemphasis Driver | 0 | 1 | 0 | 1 | X | X | X | X | 0 | 1 | 0 | 1 | 0 | 1 |
| 508 | High-Z | 0 | 0 | 0 | 1 | 0 | 1 | 0 | 1 | 0 | 1 | 1 | 0 | 0 | 1 |
| 510 | Low-power Margining (Odd Cells) | 0 | 0 | 1 | 0 | 1 | 0 | 1 | 0 | 1 | 0 | 1 | 0 | 1 | 0 |
| 512 | Low-power Margining (Even Cells) | 0 | 0 | 1 | 0 | 1 | 0 | 1 | 0 | 0 | 0 | 1 | 0 | 1 | 0 |
| 514 | Classical Margining (Odd Cells) | 0 | 0 | 0 | 1 | 0 | 1 | 0 | 1 | 1 | 0 | 0 | 1 | 0 | 1 |
| 516 | Classical Margining (Even Cells) | 0 | 0 | 1 | 0 | 1 | 0 | 1 | 0 | 0 | 1 | 0 | 1 | 0 | 1 |
| 518 | Floating CM w/differential term/squelch | 0 | 0 | 1 | 0 | 1 | 0 | 1 | 0 | 1 | 0 | 1 | 0 | 0 | 1 |
| 520 | Termination to ground | 0 | 0 | 1 | 0 | 1 | 0 | 1 | 0 | 1 | 0 | 1 | 1 | 1 | 1 |
| 522 | Termination to vdd | 0 | 0 | 1 | 1 | 1 | 1 | 1 | 1 | 1 | 1 | 0 | 0 | 0 | 0 |

SYSTEM AND METHOD FOR INTERCHANGEABLE TRANSMISSION DRIVER OUTPUT STAGE AND LOW-POWER MARGINING MODE

TECHNICAL FIELD

The present invention relates to transmission drivers that can be configured to different operating modes including a low-power margining mode.

BACKGROUND

The present invention relates to methods, devices, systems, and computer-readable media for transmission ("Tx") drivers in Serializer/Deserializer ("SerDes") environments. Tx drivers in SerDes environments must fulfill system and/or user requirements. These requirements ensure proper behavior of the system and the most efficient, or most responsive, Tx driver. One requirement is that transmission via the Tx driver cannot begin until the transmitter is coupled to the end-receiver. The end-receiver often includes a resistor connected to a channel that couples the Tx driver to the receiver. This resistor is known as a "Rx termination."

Once a connection is established between the Tx driver and the receiver, the Tx driver must be configured to sufficiently match an input impedance of the receiver, for example, the impedance of the Rx termination, and to provide an output signal having an amplitude sufficient to carry the transmitted data. To match the impedance, some conventional methods have introduced calibration and/or tuning circuits. In addition, the Tx driver must generate a signal having an amplitude of the appropriate settled voltage value as quickly as possible without drawing too much power.

When a short unit interval ("UI") is associated with data having an expected high level and is followed by a subsequent UI associated with data having an expected low level, the transmitted data typically exhibits amplitudes that do not meet the expected targets. To complicate matters, the channels situated between the output stage of the Tx driver and the receiver introduce attenuation. The attenuation introduced into the signal traversing the channel generally varies based on the frequency of the transmission. As such, because a transmitted signal comprises several frequency components, and because attenuation of these various components is uneven due to the frequency dependency of the channel loss, this signal becomes distorted. This distortion is also known as inter-symbol interference ("ISI"), in which signals from past and future transmitted UIs may blend and interfere with the currently transmitted UI, affecting its signal amplitude. Any of the physical matter used for transmission is considered a channel and is capable of introducing attenuation. As an example, conductive tracks, pads, and traces on a printed circuit board ("PCB") as well as a cable situated between a Tx driver and a receiver qualifies as a channel capable of introducing signal attenuation.

There are several conventional approaches to counteracting signal attenuation and signal integrity issues in a transmission system. Modern, high speed Tx drivers employ differential signaling, in which a data signal is transmitted by driving two channel wires with voltages of equal magnitude but opposite sign (also known as polarities). This signal is recovered differentially on the receiving end by subtracting the voltage of each of the two polarities. Ideally, during this process the common-mode portion of the signal, which is half the sum of the voltages for each polarity, should remain as constant as possible.

It is known that the output stage of a Tx driver needs to present a constant impedance matched to the channel and receiver it drives, in order to minimize reflections and maximize signal integrity. Assuming the Tx driver comprises several sub-driver elements (referred to as segments) of a higher unit impedance, the output impedance of the Tx driver is at first calibrated by enabling or disabling segments. The target Tx driver output impedance is reached when a sufficient number of these segments are enabled in parallel. This requires the Tx driver to incorporate enough segments for the case where the segment impedances are relatively high (such as in slow process conditions).

Some methods recognize that the Tx driver output stage can serve as an equalizer by blending data from different transmission cycles. Such methods introduce the option of driving emphasis data from an earlier UI (post-cursor) and/or from a subsequent UI (pre-cursor) in an attempt to achieve settled voltage values in a more reliable manner. This approach is known to reduce ISI: indeed, by introducing, as necessary, pre-cursor emphasis and/or post-cursor emphasis into the channel, the signal amplitude is representative of a voltage level closer to the expected voltage level. Post-cursor emphasis is introduced by blending the main data signal stream with a delayed version of the main data signal stream (known as post-cursor data). Pre-cursor emphasis is introduced by blending the main data signal with an advanced version of the main data signal stream (known as pre-cursor data). In addition, the final signal has conventionally been subjected to weighting criteria for each of the UIs. For example, a final data signal could be described as $C_{-1}$*(Pre-cursor data)+$C_0$*(Main data)+$C_1$(Post-cursor data), where $C_{-1}$, $C_0$, and $C_1$ are weighting coefficients. Manipulation of the data in this manner may compensate for the effects of channel attenuation. The process of blending the main data signal with emphasis data signals to equalize the output of the transmitter is known as de-emphasis.

While de-emphasis is used to compensate for uneven channel loss over frequency, some standards may also prescribe overall swing adjustments (which are independent of frequency), as signaling over short channels at full amplitude may overwhelm the far-end receiver and degrade performance. Some systems refer to this adjustment as "margining", which involves the process of dialing up or down the signal amplitude to an expected voltage level. Depending on the driver architecture, margining can be more or less easily achieved, with variable impact on overall performance.

An output stage of a voltage-mode Tx driver is configured to drive channels either via a pull-up resistor to a positive supply rail voltage ($V_{DD}$) or to a ground rail via a pull-down resistor, where the value of that resistance tries to match the characteristic impedance of the driven channel to minimize reflections. In a differential driver structure, two such output stages operate in parallel: they produce voltages that swing in opposite directions, and the overall voltage amplitude at the driver output is measured by taking the difference of these voltages. A voltage-mode Tx driver is usually segmented (i.e., built around parallel segments of higher impedance value), and the driver's impedance can be adjusted by turning on or off some of these individual segments. When implementing de-emphasis, some of the segments drive a delayed or advanced version of the bit stream to create constructive or destructive interference with the main data pattern. The number of segments assigned to de-emphasis is a function of the $C_0$, $C_1$ and $C_{-1}$ coefficients.

One way to implement margining involves decreasing the overall number of turned-on segments. This approach doesn't maintain the driver's output impedance constant. For example, if the receiver has a termination impedance of 100Ω, a Tx driver output stage meeting the generally recognized impedance matching criteria could achieve a maximum peak (differential) swing at $V_O$ (the initial voltage at the output) of $V_{DD}/2$. This is because $V_O=[100Ω/(100Ω+100Ω)]*V_{DD}$. To implement margining, this approach may decrease the maximum amplitude at $V_O$ to $V_{DD}/4$, for example, by increasing the impedance at the output stage (e.g., $V_O=[100Ω/(300Ω+100Ω)]*V_{DD}$). If an increase in the maximum amplitude were desired, at $V_O$ to $3V_{DD}/4$, for example, the impedance at the output stage could be decreased (e.g., $V_O=[100Ω/(33.33Ω+100Ω)]*V_{DD}$). Manipulation of the impedance at the output stage, however, is undesirable because the output impedance should be kept as constant as possible.

Other margining approaches have a portion of the driver segments of a given polarity drive in opposite directions (e.g., drive an inverted version of the $C_0$ bit stream), making the signal swing smaller through destructive interference while maintaining the output impedance constant. With this scheme however, the transmission increases the dissipation of power. Margining in this scenario is particularly inefficient for data signals having smaller amplitudes.

For current mode logic ("CML") type drivers, swing may be dialed down simply by decreasing the tail current of the differential pair. The driver output impedance remains mostly unaffected by this operation. However, CIVIL drivers are un-appealing from a power standpoint, as they nominally burn four times as much power as a voltage mode driver operating at full swing at equivalent power supply conditions.

FIG. 1 illustrates a circuit 100 which, when combined with several other identical or similar circuits, implements a conventional approach to transmit data signals from a Tx driver output stage. Circuit 100 is a driver segment that has a differential structure with a P-side and an M-side, and constitutes a building block of, for example, an H-bridge circuit of a Tx driver. On the P-side, the driver segment 100 includes a P-type MOSFET (e.g., 102) and an N-type MOSFET (e.g., 104). On the M-side, the driver segment includes a P-type MOSFET (e.g., 106) and an N-type MOSFET (e.g., 108). Each of the MOSFETs has, connected as an enable to its respective gate, a corresponding pre-driver (e.g., pre-drivers 120, 122, 124, and 126).

Driver segment 100 further includes a transmission gate 114, made up of PMOS 118 and NMOS 116, that is used to shunt driver outputs OUT_P and OUT_M whenever the driver segment is configured to perform margining, thereby reducing the output amplitude. Each of the P-side and the M-side further includes a resistor: resistor 110 and resistor 112, respectively. When performing margining, the conventional approach in circuit 100 establishes a virtual ground, or a differential ground, between the P-side and the M-side. By so doing, the output node (OUT_P or OUT_M) voltages of a single driver segment taken by itself become uncertain and floating—the only certainty is that OUT_P and OUT_M are at the same potential. When several driver segments are interconnected, voltages at OUT_P and OUT_M are a function of the number of segments configured to transmit data versus the number of segments configured to perform margining. From a differential mode perspective, the impedance of the Tx output driver is maintained relatively constant. On the other hand, the common-mode impedance increases with the number of segments configured for margining. Therefore, the common-mode impedance varies depending on how many additional segments are activated for margining. When all segments are configured with their shunt path active, the common-mode impedance becomes very high and the absolute potentials at OUT_P and OUT_M are mostly governed by transistor leakage currents. Some SerDes environments impose maximum or minimum common mode impedances, while others only set differential impedance constraints. Therefore, this conventional approach using circuit 100 cannot meet the impedance requirements in all SerDes environments and operating conditions. In addition, the conventional approach of circuit 100 is unreliable when OUT_P or OUT_M are close to $V_{DD}/2$.

The currently available methods, systems, and devices that tune the impedance at the output stage do not adequately maintain both signal integrity and power efficiency. These conventional methods and their associated circuit configurations each have failings. Some of the conventional methods lack controllability (and therefore, tuning accuracy). Other conventional methods do not allow for matched impedances, which detract from signal integrity. Still other conventional methods provide more reliable signals, but burn through power at low signal swings. Therefore, there is a need for methods, systems, and devices that are capable of reliably tuning the Tx driver output stage to match the input impedance of the receiver while maintaining signal integrity and power efficiency. In addition, such methods, systems, and devices could beneficially introduce circuit tuning and variation with minimal power expended in order to efficiently allow for the Tx driver output stage to be used with a variety of receiver circuits and with a variety of SerDes environment requirements.

BRIEF DESCRIPTION OF THE DRAWINGS

FIG. 5 illustrates a control table that decodes pin control signals in relation to FIG. 3 in order to selectively configure a driver segment to one of several states.

DESCRIPTION OF EXEMPLARY EMBODIMENTS

The following description of exemplary embodiments provides non-limiting representative examples referencing numerals to particularly describe features and teachings of the invention. The embodiments described should be recognized as capable of implementation separately, or in combination, with other embodiments from the description of the exemplary embodiments. A person of skill in the art reviewing the description of exemplary embodiments should be able to learn and understand the different described aspects of the invention. The description of exemplary embodiments should facilitate understanding of the invention to such an extent that other implementations of the invention, not specifically covered but within the knowledge of a person of skill in the art having read the description of exemplary embodiments, would be understood to be consistent with an application of the invention.

Figure 1:
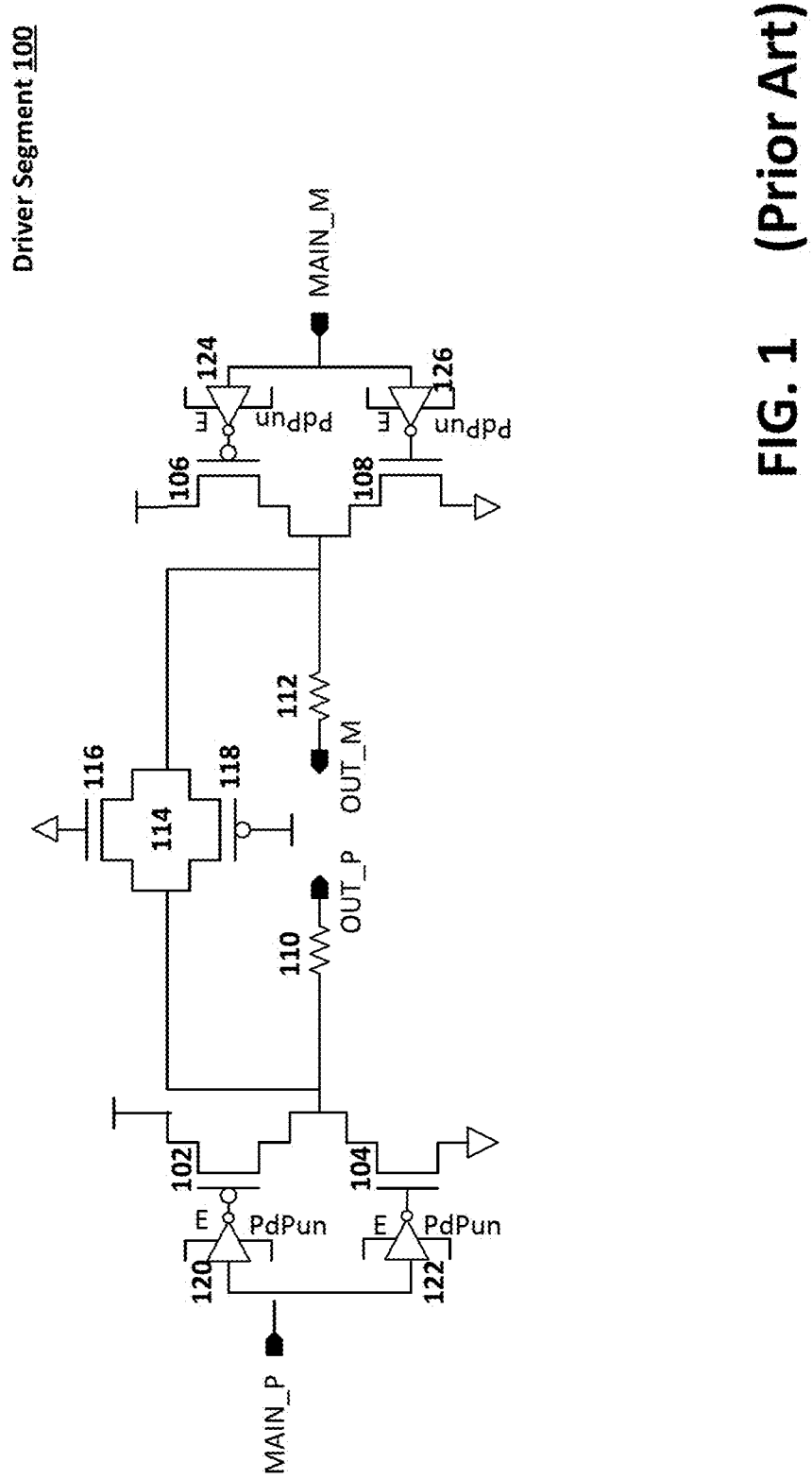
FIG. 1 illustrates a conventional Tx driver segment.
Figure 2:
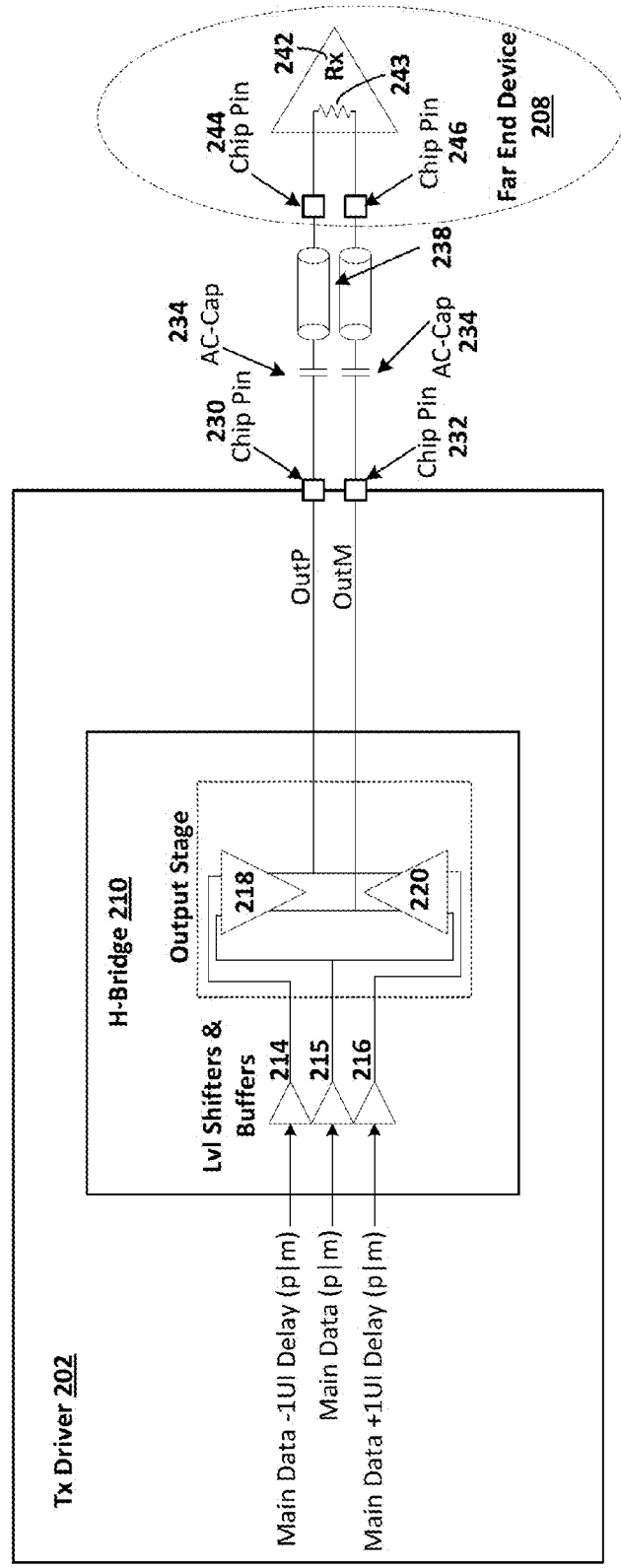
FIG. 2 illustrates a system integrating transmitter and receiver stages.

FIG. 2 illustrates a system 200 including a Tx driver 202 and a far end device 208. The device 208 includes a receiver 242 connected by a channel 238 to which the Tx output impedance and the input impedance of the receiver 242 should be matched. The input impedance of the receiver is represented by a Rx termination 243. The channel 238 allows for differential signaling. Such a connection is commonly referred to as a unidirectional link. Data is provided to the Tx driver 202 so that the channel can convey this data to the receiver. Two unidirectional links which have data flowing in opposite directions over two distinct physical channels may form a bidirectional link. In some embodiments, two such links share a common physical channel by "taking turns", a configuration known as half-duplex link.

The Tx driver 202 includes an H-bridge circuit 210 that accepts main data together with emphasis data. The H-bridge 210 forms the output stage of the Tx driver and transmits the main data over channel 238 to the receiver 242. Emphasis data, which includes the pre-emphasis and post-emphasis data described earlier, is combined with the main data at the output stage and transmitted over channel 238. The main data and the emphasis data may be transmitted to the H-bridge along independent paths. For example, the pre-cursor data, main data, and post-cursor data may be transmitted to respective level shifters and buffers 214, 215 and 216 in the H-bridge. The level shifters resolve any mixed voltage incompatibilities between the data source and the H-bridge associated with the channel in the event that the data source and the H-bridge operate off power supplies with different voltages.

The level shifters 214 to 216 supply level shifted main and emphasis data to the output stage, which blends the level shifted data using a plurality of banks. Each bank may include two input paths, with each path being permanently tied or connected by a switch to one of the data signals. For example, a first bank 218 may include paths for selectively driving main and pre-cursor data, while a second bank 220 selectively drives main and post-cursor data. The banks 218 and 220 need not be identical. One bank may, for example, include more segments than the other bank. Alternative output stage arrangements are possible, such as single bank with three input paths for selectively driving all three data signals. Each bank 218, 220 is connected to chip pins 230 and 232 and therefore able to drive a data signal onto either pin. The configuration of the segments in the output stage is described with greater detail in connection with FIGS. 5 to 13.

Chip pins 230 and 232 are representative locations of where any necessary measurements, such as current or voltage measurements, are taken relating to the Tx output to channel 238. Chip pins 244 and 246 are representative locations of where any necessary measurements, such as current or voltage measurements, are taken relating to the Rx termination side of channel 238. The channel 238 includes positive and negative polarity paths, each of which may include an AC coupling capacitor 234. The capacitors can be located on either the Tx or Rx side of the system 200.

The impedance of the Rx termination 243 can be established according to requirements designated by the SerDes target environment. For example, the impedance of the Rx termination 243 can be set to 50 ohms in a single ended implementation, and 100 ohms in a differential implementation. As noted above, the impedance of the Tx output, which is primarily attributed to the internal configuration of the output stage, can be matched to the impedance at the Rx termination.

Figure 3:
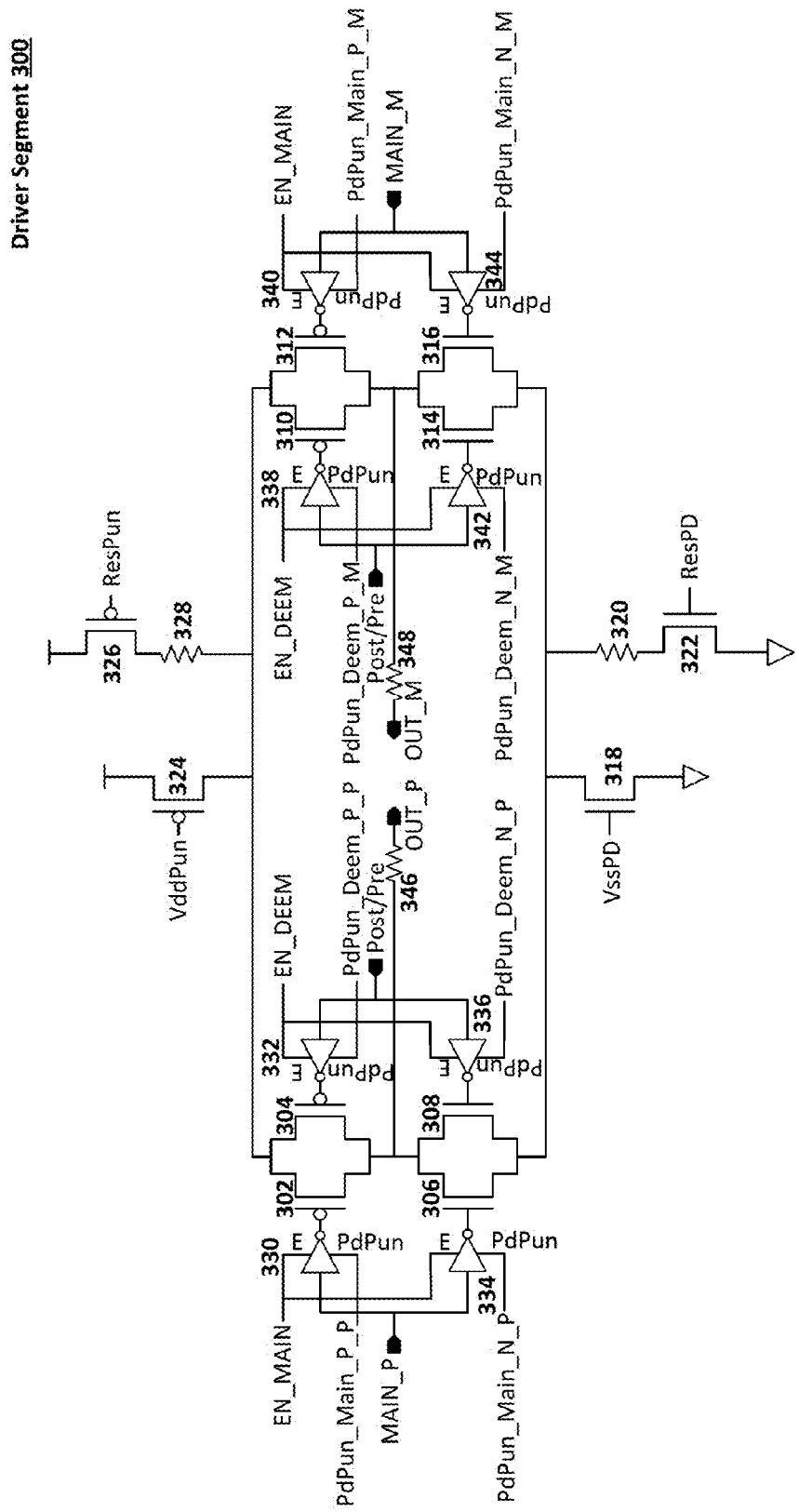
FIG. 3 illustrates an embodiment of a driver segment in a Tx driver.

FIG. 3 illustrates a driver segment 300. Several of these segments are grouped together to form a Tx output stage. The driver segment 300 has a differential structure with a P-side and an M-side. Driver segment 300 can be a single segment of, for example, the H-bridge 210 in FIG. 2 and could be included in bank 218 or bank 220. On the P-side, the driver segment 300 includes P-type MOSFETs (e.g., 302 and 304) and N-type MOSFETs (e.g., 306 and 308). Similarly, on the M-side, the driver includes P-type MOSFETs (e.g., 310 and 312) and N-type MOSFETs (e.g., 314 and 316). Each of the MOSFETs has, connected as an enable to its respective gate, a corresponding pre-driver (e.g., pre-drivers 330, 332, 334, 336, 338, 340, 342, and 344). The pre-drivers are described with greater detail in FIG. 4. Driver segment 300 further includes a PMOS activated connection to $V_{DD}$ via PMOS 324 and an NMOS activated connection to ground via NMOS 318.

In addition, driver segment 300 may optionally include a pull-up resistor 328 and PMOS 326 activated connection to $V_{DD}$ as well as a pull-down resistor 320 and NMOS 322 activated connection to ground. Each of the P-side and the M-side further includes an output resistor which normally provides the bulk of a driver's output impedance: resistor 346 and resistor 348, respectively. The connection to $V_{DD}$ via 326 and 328, and the connection to ground via 320 and 322 are included in driver segment 300 specifically for use during low-power margining, as will be explained with regard to FIG. 9. The resistors 328/320 and transistors 326/322 provide an additional level of control for adjusting the impedance of the MOS devices 302, 304, 306, 308, 310, 312, 314 and 316, but may not be required in certain applications or for certain supply voltage levels.

As is typical for NMOS switching configurations, each of the NMOS switches described with regard to FIG. 3 conducts between its respective source and drain when the voltage applied at the gate exceeds the voltage applied at the source by a voltage $V_{NThreshold}$, which is particular to the NMOS switches. Similarly, each of the PMOS switches described with regard to FIG. 3 conducts between its respective source and drain when the voltage applied at the gate is less than the voltage applied at the source plus a (negative) voltage $V_{PThreshold}$, which is particular to the PMOS switches. In the majority of scenarios, the driver segment 300 employs both of the NMOS and PMOS switches, so there is usually a conducting switch. In some scenarios, only the NMOS switches conduct (i.e., gate voltages exceed $V_{NThreshold}$). In other scenarios, only the PMOS switches conduct (i.e., gate voltages are less than the sum of $V_{DD}$ and the negative $V_{PThreshold}$). In yet some other scenarios both the NMOS switches and the PMOS switches are conducting. Finally, in some specific cases, all of the NMOS and PMOS switches can be turned OFF. Generally, a PMOS switch is OFF when the PMOS gate is tied to $V_{DD}$ and an NMOS switch is OFF when the NMOS gate is tied to ground. When the PMOS switches and NMOS switches are OFF, they exhibit a large impedance.

In addition, each of the P-side and the M-side is configured to receive, if enabled, either main data ("MAIN_P" and "MAIN_M") or emphasis data ("Post/Pre"). Thus, for example, the P-side can be configured to drive either main data or whichever of the precursor data and the post-cursor data is provided to its Post/Pre input. The main data is enabled by a main data enable ("EN_MAIN") and the emphasis data is enabled by an emphasis data enable ("EN_DEEM"). Output from the P-side of the differential driver segment 300 is provided through the output resistor 346 via pin "OUT_P." Output from the M-side of the differential driver segment 300 is provided through the output resistor 348 via pin "OUT_M". The signals "PdPun_Main_P_P", "PdPun_Main_N_P", "PdPun_Main_P_M" "PdPun_Main_N_M" "PdPun_Deem_P_P", "PdPun_Deem_N_P", "PdPun_Deem_P_M", and "PdPun_Deem_N_M" refer to enable signals provided to the pre-drivers 330, 334, 340, 344, 332, 336, 338, and 342, respectively.

Figure 4:
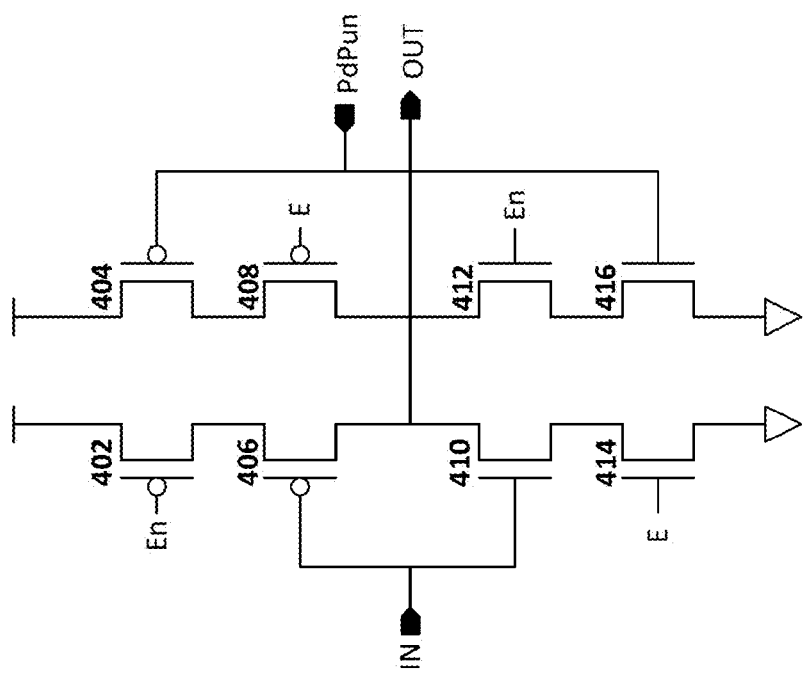
FIG. 4 illustrates a portion of a pre-driver in a driver segment.

FIG. 4 illustrates a portion 400 of a pre-driver employed inside a driver segment. The partial pre-driver 400 is representative of any one of the pre-drivers 330, 332, 334, 336, 338, 340, 342, and 344 in FIG. 3. The partial pre-driver 400 includes eight MOSFETs. Four of the eight MOSFETS are P-type MOSFETs (i.e., 402, 404, 406, and 408). The partial pre-driver 400 further includes four N-type MOSFETs (i.e., 410, 412, 414, and 416). The "IN" pin depicted in FIG. 4 refers to the "MAIN_P", "MAIN_M" or "Post/Pre" data provided to the respective pre-driver. The "OUT" pin depicted in FIG. 4 refers to the voltage applied to the gate of a MOSFET controlled by the respective pre-driver. For example, pre-drivers 330, 332, 334, 336, 338, 340, 342, and 344 provide "OUT" gate voltages to, respectively, MOSFETS 302, 304, 306, 308, 310, 312, 314, and 316.

The "En" (not shown in FIG. 3) and "E" pins refer to the "EN_MAIN" (and its inverse) or "EN_DEEM" (and its inverse) signals shown in FIG. 3. The "En" and "E" pins determine whether the main or emphasis data stream is passed on to its receiving MOSFETs at the "OUT" pin, or whether a static voltage is applied at the gate of the receiving MOSFETs. The PdPun pin depicted in circuit 400 can be any one of the PdPun pins discussed with regard to driver segment 300. The PdPun pins become effective only when the "E"/"En" pins deactivate the data path, and determine what static polarity is applied at a pre-driver's output. When "E"/"En" activate the main data path, a signal pair of identical polarity is provided to NMOS-PMOS pairs 302/306 and 312/316. When "E"/"En" activate the de-emphasis path, a signal pair of identical polarity is provided to NMOS-PMOS pairs 304/308 and 310/314. When "E"/"En" de-activate the main data path or de-emphasis data-path, static signals are provided to the gates of their respective NMOS or PMOS drivers. The polarities of these static signals are governed by the state of the PdPun pins, and are a function of the state in which the driver segment is configured. For instance, if a driver segment is configured to drive main data, gates of transistors 304 and 310 get statically pulled high, and gates of transistors 308 and 314 get statically pulled low. Conversely, if that same driver segment is configured to drive emphasis data instead, gates of transistors 302 and 312 get statically pulled high, and gates of transistors 306 and 316 get statically pulled low. Another possible scenario is when the segment is configured to perform margining. In that case, all driver transistors (302, 304, 306, 308, 310, 312, 314 and 316) are driven with static gate voltages, where the specific gate voltage is a function of whether the segment is configured to perform a pull-high or a pull-low action, as detailed later on.

The embodiment of FIG. 3 uses parallel MOS devices in the output stage to multiplex between the main and emphasis data based on the states of the "E"/"En" pins. However, it is equally possible to implement a multiplexing structure within the pre-driver itself. Thus, in an alternative embodiment, multiplexing can be performed by controlling the pre-drivers.

FIG. 5 illustrates a control table 500 that decodes pin control signals for the segment in FIG. 3, in order to selectively configure the segment to one of many possible driving states. These segment driving states are further depicted in FIGS. 6 to 13. The segments in the output driver can be independently configured and need not be set to the same state. For example, when the Tx driver is switched from a full amplitude transmission mode to a margining mode, some segments can be set to a transmitting state (504 or 506) while other segments are simultaneously set to a classical margining state (514 or 516) or a low-power margining state (510 or 512). The control table 500 provides decoded controls signal values 524 for each of the pins in FIG. 3 and for each driving state 502. The driving states 502 illustrated in control table 500 include: Main Driver 504, De-emphasis Driver 506, High Impedance Driver 508, Low-power Margining (for a first half of the cells) 510, Low-power Margining (for a second half of the cells) 512, Classical Margining (for the first half of the cells) 514, Classical Margining (for the second half of the cells) 516, Floating Common Mode Driver 518, Termination to Ground Driver 520, and Termination to $V_{DD}$ Driver 522.

The decoded controls 524 include EN_MAIN, which enables transmission of main data, and further include EN_DEEM, which enables transmission of emphasis data. As discussed in the foregoing, each of the Pd_pun pins decodes an input associated with one of the eight pre-drivers associated with a particular one of the eight MOSFETs. VddPun is a signal that can activate or deactivate the connection of the driver segment 300 to $V_{DD}$ using PMOS 324. VssPd is a signal that can activate or deactivate the connection of the driver segment 300 to ground using NMOS 318 in driver segment 300. ResPD is a signal that can activate or deactivate the connection of the driver segment 300 to ground using NMOS 322 and via resistor 320. ResPun is a signal that can activate or deactivate the connection of the driver segment 300 to $V_{DD}$ using PMOS 326, via resistor 328, in driver segment 300. ResPD and ResPun are particularly important signals during the low-power margining driver control.

Commands that control the states 502 of the driver, i.e., control signal combinations, can be issued from a controller circuit (not shown) connected to the Tx driver. The control table 500 can be used by the controller to set a state 502 of any of the active segments in the Tx driver output stage on an independent basis. With regard to states 510, 512, 514, and 516, the controller usually sets the states of the segments in pairs. For example, each time a segment is set to a low-power margining state in accordance with state 510, a corresponding segment is set to a low-power margining state in accordance with state 512. Similarly, each time a segment is set to a classical margining state in accordance with state 514, a different segment is set to a classical margining state in accordance with state 516.

Figure 6:
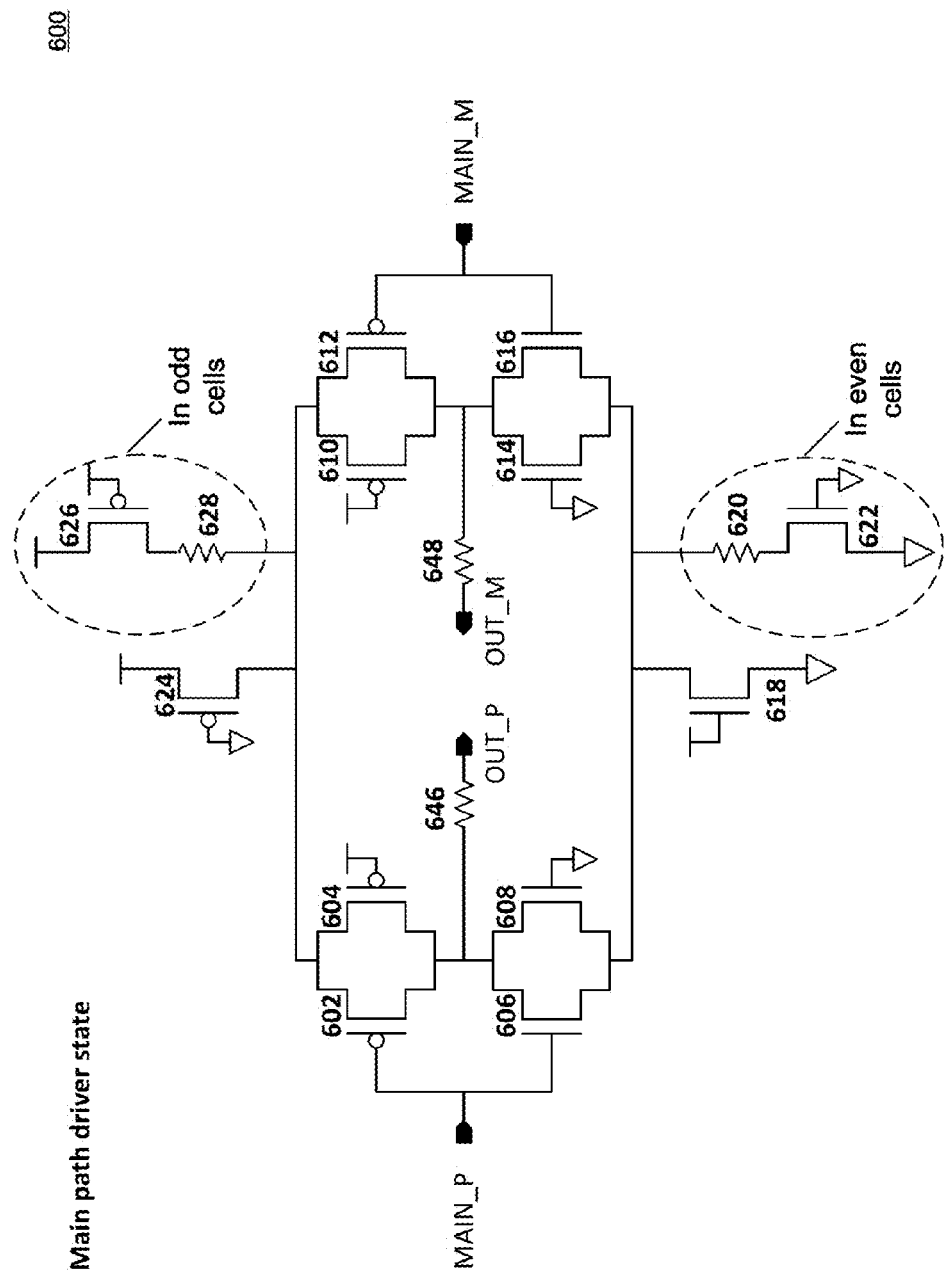
FIG. 6 illustrates a circuit depicting a driver segment configured to a main path driver state.

FIG. 6 illustrates a circuit 600 depicting a driver segment configured to a main path driver state, i.e., to drive main data. PMOS 602, 604, 610, 612, 624 and 626 are analogous to PMOS 302, 304, 310, 312, 324 and 326 in FIG. 3, respectively. NMOS 606, 608, 614, 616, 618 and 622 are analogous to NMOS 306, 308, 314, 316, 318 and 322, respectively. Resistors 620 and 628 are analogous to resistors 320 and 328, respectively. Resistors 646 and 648 are analogous to resistors 346 and 348, respectively.

To set the driver segment to the circuit 600, the controller issues a command to enter state 504. The circuit 600 is a simplified equivalent circuit emphasizing the active components in driver segment 300 during the main path driver state while omitting pre-driver circuits for the sake of clarity. During the main path driver state, control signals from the controller activate PMOS 624 and NMOS 618 while enabling PMOS 602, PMOS 612, NMOS 606 and NMOS 616. The remaining MOSFETs are disabled, and resistors 620 and 628 are shunted. Accordingly, differential data for the main data is provided to the circuit via both of the MAIN_P and MAIN_M pins. Depending upon the value of the main data, at least one of the PMOS and NMOS switches in each of the P-side and the M-side of the differential circuit transmit the main data by forming a current path on each side, between the respective driver output (OUT_P or OUT_M) and one of the rails ($V_{DD}$ or ground), with the driver outputs being connected to opposite rails. For example, at least one of PMOS 602 and NMOS 606 transmit the main data via the resistor 646 to the OUT_P pin. Similarly, at least one of PMOS 612 and NMOS 616 transmit the inverted main data via the resistor 648 to the OUT_M pin. Which driver output is connected to which rail depends on the value of the input data signal at any given time. Thus, the current paths are formed dynamically.

Figure 7:
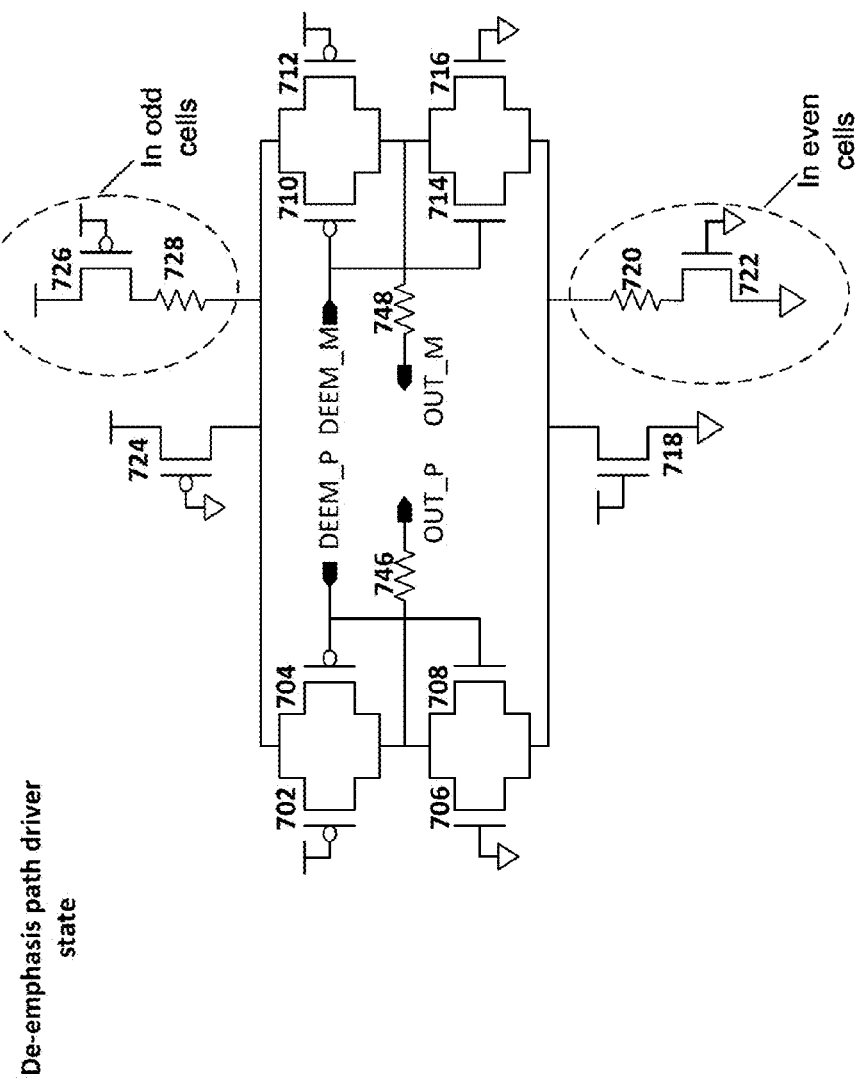
FIG. 7 illustrates a circuit depicting a driver segment configured to a de-emphasis path driver state.

FIG. 7 illustrates a circuit 700 depicting a driver segment configured to a de-emphasis path driver state, i.e., to drive precursor or post-cursor data. PMOS 702, 704, 710, 712, 724 and 726 are analogous to PMOS 302, 304, 310, 312, 324 and 326 in FIG. 3, respectively. NMOS 706, 708, 714, 716, 718 and 722 are analogous to NMOS 306, 308, 314, 316, 318 and 322, respectively. Resistors 720 and 728 are analogous to resistors 320 and 328, respectively. Resistors 746 and 748 are analogous to resistors 346 and 348, respectively.

To set the driver segment to the circuit 700, the controller issues a command to enter state 506. The circuit 700 is a simplified equivalent circuit emphasizing the active components in driver segment 300 during the de-emphasis path driver state while omitting pre-driver circuits for the sake of clarity. During the de-emphasis path driver state, control signals from the controller activate PMOS 724 and NMOS 718 while enabling PMOS 704, NMOS 708, PMOS 710 and NMOS 714. The remaining MOSFETs are disabled, and resistors 720 and 728 are shunted. Accordingly, differential signals comprising the emphasis data are provided to the circuit via both of the DEEM_P and DEEM_M pins. Depending upon the value of the emphasis data, at least one of the PMOS and NMOS switches in each of the P-side and the M-side of the differential circuit transmit the emphasis data. For example, at least one of PMOS 704 and NMOS 708 transmit the emphasis data via the resistor 746 to the OUT_P pin. Similarly, at least one of PMOS 710 and NMOS 714 transmit the inverted emphasis data via the resistor 748 to the OUT_M pin.

Figure 8:
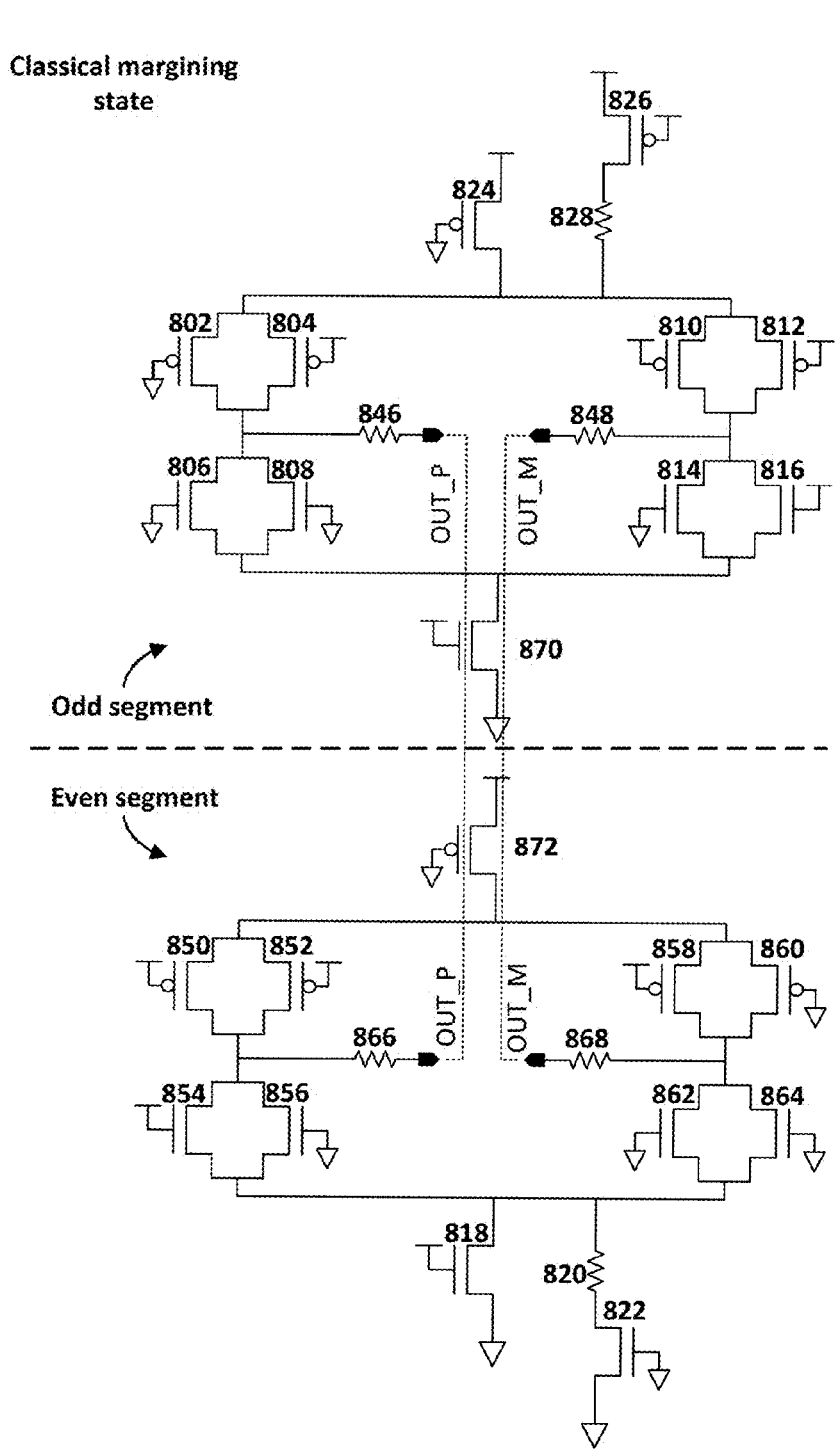
FIG. 8 illustrates a circuit depicting a pair of driver segments configured to a classical margining state.

FIG. 8 illustrates a circuit 800 depicting two driver segments configured to a classical margining state. In a first (odd) driver segment, PMOS 802, 804, 810, 812, 824 and 826 are analogous to PMOS 302, 304, 310, 312, 324 and 326 in FIG. 3, respectively. NMOS 806, 808, 814, 816 and 870 are analogous to NMOS 306, 308, 314, 316 and 318, respectively. Resistor 828 is analogous to resistor 328. Resistors 846 and 848 are analogous to resistors 346 and 348, respectively. In a second (even) driver segment, PMOS 850, 852, 858, 860 and 872 are analogous to PMOS 302, 304, 310, 312 and 324 in FIG. 3, respectively. NMOS 854, 856, 862, 864, 818 and 822 are analogous to NMOS 306, 308, 314, 316, 318 and 322, respectively. Resistor 820 is analogous to resistor 320. Resistors 866 and 868 are analogous to resistors 346 and 348, respectively.

To set the driver segment pair to the circuit 800, the controller issues a command to enter state 514 in half of the active segments and state 516 in another half of the active segments. The circuit 800 is a simplified equivalent circuit emphasizing the active components in two instances of the driver segment 300 during classical margining, while omitting pre-driver circuits for the sake of clarity. In the first segment, control signals from the controller activate PMOS 824, PMOS 802, NMOS 816, and NMOS 870, and resistor 828 is shunted. In the second segment, control signals from the controller activate PMOS 872, PMOS 860, NMOS 854, and NMOS 818, and resistor 820 is shunted. Accordingly, the classical margining state is enacted via both of the segments. In the first segment, the OUT_P pin exercises a pull-up action towards $V_{DD}$ and the OUT_M pin exercises a pull-down action towards ground, with strengths proportional to their respective driving impedances. In the second segment, the inverse of the outcome of the first segment will be true: the OUT_P pin exercises a pull-down action towards ground and the OUT_M pin exercises a pull-up action toward $V_{DD}$, with strengths proportional to their respective driving impedances. The net effect is that OUT_P and OUT_M are pulled towards $V_{DD}/2$ with a strength twice as big as that of the individual segments' pull-up or pull-down effects.

Devices other than MOSFETs 802, 816, 854 and 860 could be used to enable this margining mode. For instance, margining PMOS 802 could be replaced by PMOS 804, 810 or 812, margining NMOS 816 could be replaced by NMOS 806, 808 or 814, margining PMOS 860 could be replaced by PMOS 850, 852 or 858, and NMOS 854 could be replaced by NMOS 856, 862 or 864. The main constraint is that if one segment exercises a pull-up action on an output pin (OUT_P or OUT_M), the counterpart segment should exercise a pull-down action on that same pin. A secondary consideration is that one single segment should ideally avoid exercising an all pull-up or all pull-down action on both output pins (i.e. avoid having one segment only perform a pull-up action and the other only a pull-down action), so as to limit the current flowing through devices 824, 870 872 and 818, even though this restriction is not an essential condition to implement classical margining. Also, variants such as enabling PMOS 804 for pull-up action at the same time as PMOS 802, enabling NMOS 814 for pull-down action at the same time as NMOS 816, etc., are valid alternatives to the configuration illustrated in FIG. 8.

In the classical margining configuration of FIG. 8, current flows from $V_{DD}$ to ground through two distinct paths, one path going through OUT_P and one path going through OUT_M, without passing through an external resistor as it would do when driving main or emphasis data. This power dissipation serves no other purpose than maintaining the overall driver impedance substantially constant, both from a common-mode and a differential-mode perspective. In fact, the average power dissipation inside an output driver stage performing margining in the sense of the classical margining state of FIG. 8 can be up to twice as high as the power dissipation inside such a stage when transmitting main or emphasis data. It is possible to lower power dissipation by not maintaining the common-mode impedance when performing margining. The configuration in FIG. 9 achieves this.

Figure 9:
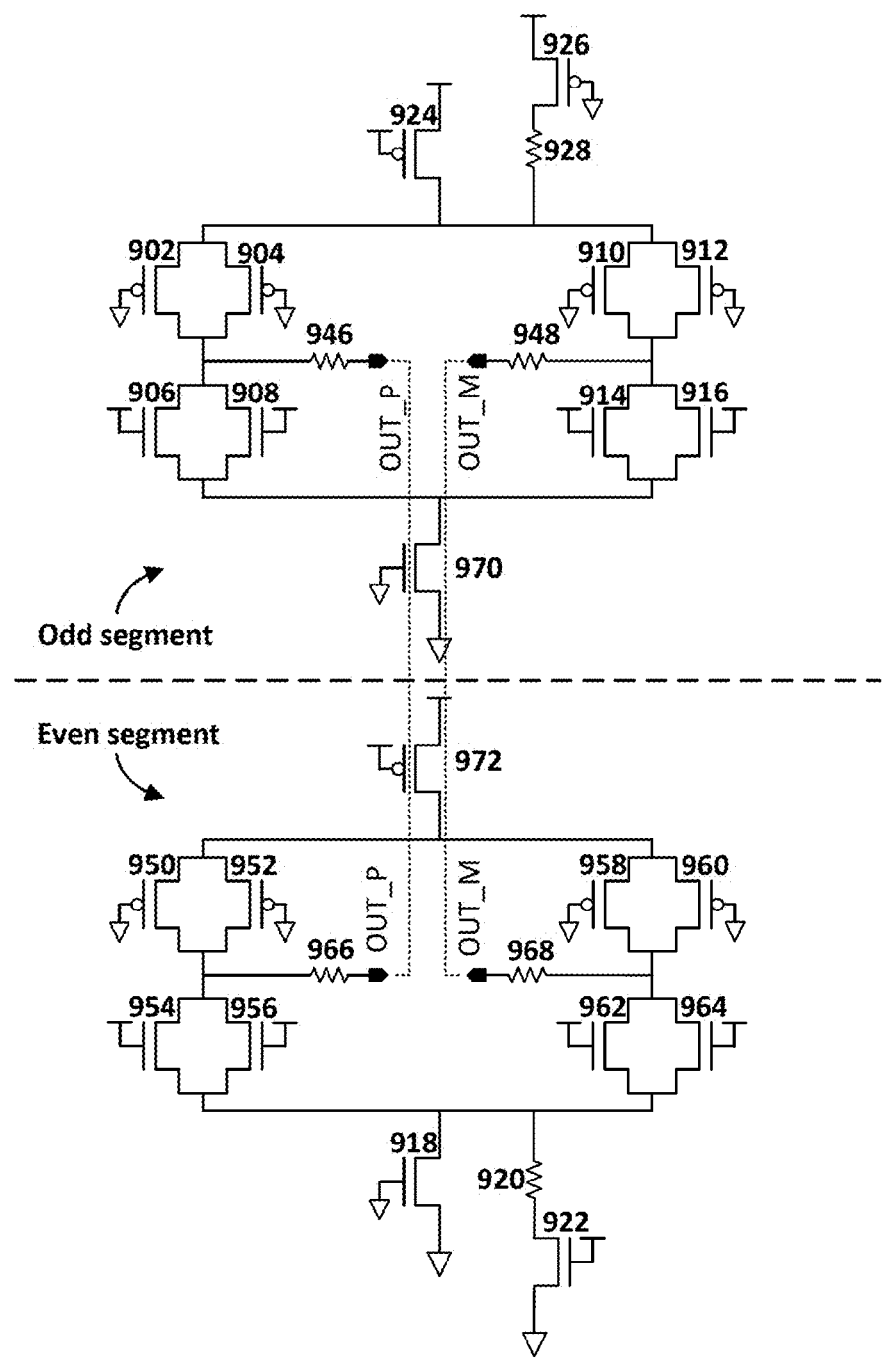
FIG. 9 illustrates a circuit depicting a pair of driver segments configured to a low-power margining state.

FIG. 9 illustrates a circuit 900 corresponding to a low-power margining state, which provides lower power dissipation compared to the configuration in FIG. 8. Circuit 900 depicts two driver segments configured to this low-power margining state.

In a first (odd) driver segment, PMOS 902, 904, 910, 912, 924 and 926 are analogous to PMOS 302, 304, 310, 312, 324 and 326 in FIG. 3, respectively. NMOS 906, 908, 914, 916 and 970 are analogous to NMOS 306, 308, 314, 316 and 318, respectively. Resistor 928 is analogous to resistor 328. Resistors 946 and 948 are analogous to resistors 346 and 348, respectively. In a second (even) driver segment, PMOS 950, 952, 958, 960 and 972 are analogous to PMOS 302, 304, 310, 312 and 324 in FIG. 3, respectively. NMOS 954, 956, 962, 964, 918 and 922 are analogous to NMOS 306, 308, 314, 316, 318 and 322, respectively. Resistor 920 is analogous to resistor 320. Resistors 966 and 968 are analogous to resistors 346 and 348, respectively.

To set the driver segment pair to the circuit 900, the controller issues a command to enter state 510 in half of the active segments and state 512 in another half of the active segments. Unlike the transmission states, the low-power and classical margining states are static configurations in which the gate inputs of the MOSFETs are held constant. The circuit 900 is a simplified equivalent circuit emphasizing the active components in two instances of the driver segment 300 during the low-power margining state while omitting pre-driver circuits for the sake of clarity. In the first segment, control signals from the controller activate PMOS 926, PMOS 902, PMOS 904, PMOS 910, and PMOS 912.

In the second segment, control signals from the controller activate NMOS 922, NMOS 954, NMOS 956, NMOS 962, and NMOS 964. Additionally, NMOS 906, 908, 914 and 916 are activated in the first segment and PMOS 950, 952, 958 and 960 are activated in the second segment. Although not strictly required, the activation of the additional NMOS devices 906, 908, 914 and 916 and the additional PMOS devices 950, 952, 958 and 960 further reduces the total differential impedance contributed by the MOS devices between OUT_P and OUT_M. In each of the first segment and the second segment, the amount of current that can pass through the respective PMOS portion (in the first segment) and the NMOS portion (in the second segment) is limited.

Lower power is achieved in the configuration of FIG. 9 compared to that of FIG. 8 because the header path connecting the first driver segment to $V_{DD}$ and the footer path connecting the second driver segment to ground are more resistive (i.e., lower current paths), producing internal voltage drops that limit the amount of current that flows from $V_{DD}$ to ground. For instance, PMOS 924 in the first segment and NMOS 918 in the second segment are deactivated, reducing the amount of current that can flow from $V_{DD}$ to ground. Some current can still flow through resistors 920 and 928, but to a lesser degree. The impedances between OUT_P or OUT_M and their respective supplies ($V_{DD}$ or ground) are correspondingly increased: the voltage drops further reduce the available gate-source voltage of the pull-up/pull-down MOS devices connected to the headers and footers, making it harder to turn them on, hence increasing their resistivity.

Resistor 928 establishes a voltage differential in the header of the circuit 900. By generating a voltage drop in the header, the pull-up transistors in the first segment (i.e., 902, 904, 910, and 912) are activated, or turned on, with a smaller gate-source voltage, increasing their impedance compared to the case where resistor 928 is shunted (such as with the classical margining configuration). Similarly, the resistor 920 establishes a voltage differential in the footer of the circuit 900. By generating a voltage drop in the footer, the pull-down transistors in the second segment (i.e., 954, 956, 962, and 964) are activated, or turned on, with a lesser gate-source voltage, increasing their impedance compared to the case where resistor 920 is shunted (such as with the classical margining state). Thus, the lower current pull-up and pull-down paths induce a gate-source voltage that is reduced in comparison to when the less resistive (higher current) paths are used, yet still sufficient to activate the corresponding pull-up and pull-down transistors. In some implementations, the pull-up elements 926 and 928 and the pull-down elements 920 and 922 can be omitted or replaced with different circuits, such as operational amplifiers.

Because part of a Tx driver's output impedance relies on the resistivity of the pull-up and pull-down MOS devices, the differential impedance (measured between OUT_P and OUT_M) would normally increase as a consequence of the voltage drop inside the headers and footers. As a matter of fact, greater voltage drops in the voltage and footer lead to greater power savings at the expense of an increase in differential impedance—thus a compromise between economy of power and maintaining the differential impedance within specifications must be struck. The differential impedance between the outputs OUT_P and OUT_M can, however, be maintained substantially constant relative to the configurations of FIGS. 6 to 8 by turning on more of the parallel devices connected to these headers and footers to compensate for the increase. For instance, there are twice as many active switching PMOS devices (902, 904, 910 and 912) in the configuration of FIG. 9 compared to the configuration of FIG. 8 (802 and 860). Also, there are twice as many active switching NMOS devices (954, 946, 962 and 964) in the configuration of FIG. 9 compared to the configuration of FIG. 8 (816 and 854). The low-power margining state is therefore enacted via segments which have a weak pull-up path and segments which have a weak pull-down path. These lower current paths extend through transistors which are also used to transmit data in the main path driver and de-emphasis path driver states, reusing those transistors for margining instead of data transmission.

In the first segment, both of the OUT_P and the OUT_M pins exercise a pull-up effect dependent upon the impedance values of resistors 928, 946, and 948, and to a lesser extent, the impedance values of PMOS transistors 902, 904, 910 and 912. In the second segment, both of the OUT_P and the OUT_M pins exercise a pull-down effect dependent upon the impedance values of resistors 966, 968 and 920, and to a lesser extent, the impedance values of NMOS transistors 954, 956, 962 and 964. In FIG. 9, pull-up and pull-down paths involve PMOS pairs 902/904 and 910/912, and NMOS pairs 954/956 and 962/964. Turning on PMOS pairs and NMOS pairs in this fashion is useful to reduce the transistor-related component of the overall segment impedance, and at least partially compensates for higher MOS impedance incurred by the reduced gate-source voltages of devices 902, 904, 910, 912, 954, 956, 962 and 964 in the low-power margining state. This is, however, not an absolute requirement in any way, and only one out of two devices within these pairs can be turned on at a time.

Although the configuration of FIG. 9 seeks to maintain the differential impedance of the transmitting states (FIGS. 6 and 7) with less power consumption than the configuration of FIG. 8, the common mode impedance is substantially different than in FIGS. 6 to 8. In FIG. 8, the paths which connect each of the driver outputs (OUT_P and OUT_M) to $V_{DD}$ or ground are essentially unconnected, with the exception of sharing the positive supply and ground rails. This separation of the paths permits the impedance on the P-side to be established independently of the impedance on the M-side, and using essentially the same impedance producing elements as in FIGS. 6 and 7, thus providing better matching to the impedances used during normal data transmission compared to the configuration of FIG. 9. In FIG. 9, OUT_P and OUT_M are connected through nodes located at the header of the first segment and the footer of the second segment, establishing a differential path between OUT_P and OUT_M so that it is no longer possible to independently establish the impedance on each side. The configuration of FIG. 9 may be referred to as a termination to a common mode voltage (VCM) or squelched state when all active segments of the driver are configured to this state. In general, squelching may be achieved by configuring all of a driver's active segments to margining, either in the classical or low-power sense.

The use of separate paths is not an absolute requirement for classical margining. For example, the common paths used in FIG. 9 could be used to implement classical margining if the resistors 920/928 were bypassed (assuming that the transistors 922/926 contribute negligible resistance). Nevertheless, keeping the paths separate as in FIG. 8 has some inherent advantages, such as reducing the risk of long term reliability problems in the header and footer transistors by distributing current across more of these devices (e.g., 824/870/872/818 versus 926/922), in addition to the above noted benefit of better matching to the transmission impedances.

With regard to both circuit 800 in FIG. 8 and circuit 900 in FIG. 9, reference has been made to a first half of the segments and a second half of the segments. Alternatively, reference has on occasion been made to "even" segments and "odd" segments. In particular, when N segments are active in the Tx output driver (with N being a multiple of 2), a total of N/2 odd segments are controlled, more specifically from n=1, 3, 5 . . . to n=N−1, by the controller to drive according to state 510 for low-power margining and state 514 for classical margining. Similarly, when N segments are active in the Tx output driver, a total of N/2 even segments are controlled, more specifically from n=0, 2, 4, to n=N−2, by the controller to drive according to state 512 for low-power margining and state 516 for classical margining. Other methods of splitting the segments into two equally sized groups include: a first group of segments which are driven in accordance with state 510 for low-power margining and state 514 for classical margining, and a second group of segments which are driven in accordance with state 512 for low-power margining and state 516 for classical margining. In the event that the total number of active segments, N, is an odd number, one of the N segments may be deactivated so that the number of segments is N−1. Alternatively, in the event that N is an odd number, an additional segment may be activated so that the number of active segments is N+1.

Figure 10:
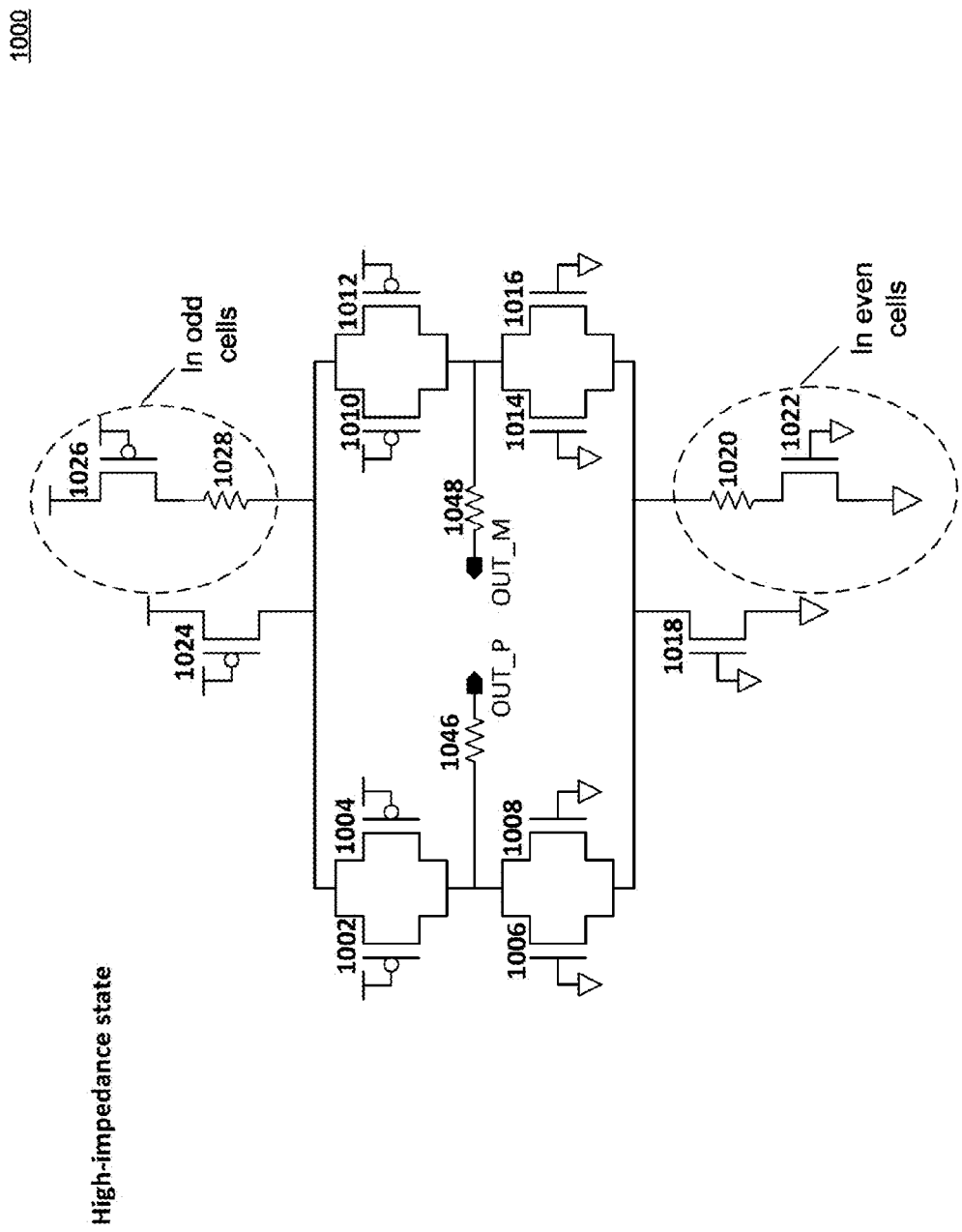
FIG. 10 illustrates a circuit depicting a driver segment configured to a high-impedance state.

FIG. 10 illustrates a circuit 1000 depicting a driver segment configured to a high-impedance state. PMOS 1002, 1004, 1010, 1012, 1024 and 1026 are analogous to PMOS 302, 304, 310, 312, 324 and 326 in FIG. 3, respectively. NMOS 1006, 1008, 1014, 1016, 1018 and 1022 are analogous to NMOS 306, 308, 314, 316, 318 and 322, respectively. Resistors 1020 and 1028 are analogous to resistors 320 and 328, respectively. Resistors 1046 and 1048 are analogous to resistors 346 and 348, respectively.

To set the driver segment to the circuit 1000, the controller issues a command to enter state 508. The circuit 1000 is a simplified equivalent circuit emphasizing the active components in driver segment 300 during the high-impedance state while omitting pre-driver circuits for the sake of clarity. During the configuration of the high-impedance state, control signals from the controller deactivate all of the MOSFETs. Accordingly, the circuit does not drive any differential data onto the OUT_P and OUT_M pins. In this state, all of the outputs (e.g., OUT_P and OUT_M) for the segment are not driven. When all segments of the driver are put in this high-impedance state, the value of the voltage supplied at OUT_P and OUT_M is unknown, but somewhere in the range of 0 to $V_{DD}$. When only some of the segments of the driver are put in this high-impedance state, the value of the voltage supplied at OUT_P and OUT_M is defined by the impedances of those segments that remain active (i.e., that either transmit emphasis or main data, or perform margining), and the far-end termination's (e.g., receiver 242 in FIG. 2) impedance value. The high-impedance state therefore serves two main purposes. First, it enables calibration of a driver's output impedance to overcome process variations by adjustment of the number of segments which are put in a high impedance state versus those segments which are in one of the active states. When segments exhibit a higher driving resistance, a greater number of active segments is required and fewer segments are put in a high-impedance state; conversely, when segments exhibit a smaller driving resistance, a smaller number of active segments is required and more segments are put in a high-impedance state.

Second, the high-impedance state allows a driver stage to be turned off completely. In FIG. 10, PMOS devices 1024, 1026, 1002, 1004, 1010 and 1012 all have their gates tied to $V_{DD}$, and having all these devices turned off maximally weakens the pull-up path, thereby reducing leakage current from $V_{DD}$ to OUT_P or OUT_M. Similarly, NMOS devices 1006, 1008, 1014, 1016, 1018 and 1020 all have their gates tied to ground, and having all these devices turned off maximally weakens the pull-down path, thereby reducing leakage current from OUT_P or OUT_M to ground. However, other configurations are possible, such as one where only devices 1002, 1004, 1010, 1012, 1006, 1008, 1014, and 1016 are turned off, that will achieve a similar high-impedance state at the expense of reduced isolation to supply rails.

Figure 11:
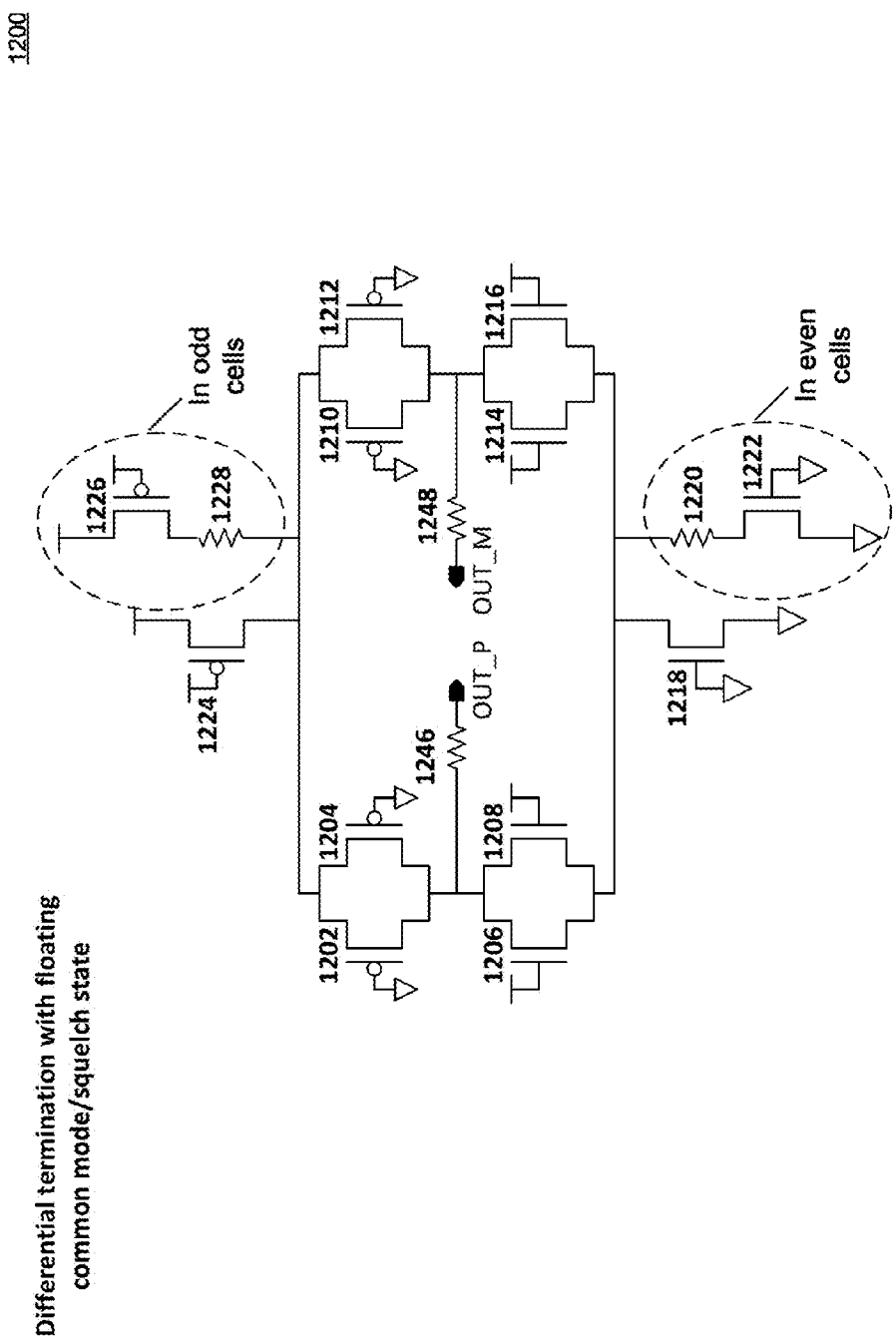
FIG. 11 illustrates a circuit depicting a driver segment configured to a differential termination with floating common mode state.

FIG. 11 illustrates a circuit 1200 depicting a driver segment configured as a differential termination with a floating common mode. FIG. 11 is also a squelched configuration. PMOS 1202, 1204, 1210, 1212, 1224 and 1226 are analogous to PMOS 302, 304, 310, 312, 324 and 326 in FIG. 3, respectively. NMOS 1206, 1208, 1214, 1216, 1218 and 1222 are analogous to NMOS 306, 308, 314, 316, 318 and 322, respectively. Resistors 1220 and 1228 are analogous to resistors 320 and 328, respectively. Resistors 1246 and 1248 are analogous to resistors 346 and 348, respectively.

To set the driver segment to the circuit 1200, the controller issues a command to enter state 518. The circuit 1200 is a simplified equivalent circuit emphasizing the active components in driver segment 300 during the floating common mode state while omitting pre-driver circuits for the sake of clarity. During the floating common mode state, the controller activates PMOS 1202, PMOS 1204, PMOS 1210, PMOS 1212, NMOS 1206, NMOS 1208, NMOS 1214, and NMOS 1216. Accordingly, a differential path is established between pins OUT_P and OUT_M whose impedance is the sum of resistors 1246 and 1248, plus the equivalent parallel impedance presented by transistors 1202, 1204, 1206 and 1208 and the equivalent parallel impedance presented by transistors 1210, 1212, 1214 and 1216.

When all active segments of the driver are set to the floating common mode state, a fully squelched output is produced at the Tx output pins, and the common mode is defined either by leakage or any other external circuit that might set it. When only a subset of the active segments of the driver is set to the floating common mode state, an even lower-power margining strategy than that associated with states 510 and 512 is achieved. This is because PMOS transistors 1202, 1204, 1210 and 1212 are more weakly turned on than they are in state 510, and because NMOS transistors 1206, 1208, 1214 and 1216 are more weakly turned on than they are in state 512. However, the differential impedance of circuit 1200 is greater and more variable than that of circuit 900.

Figure 12:
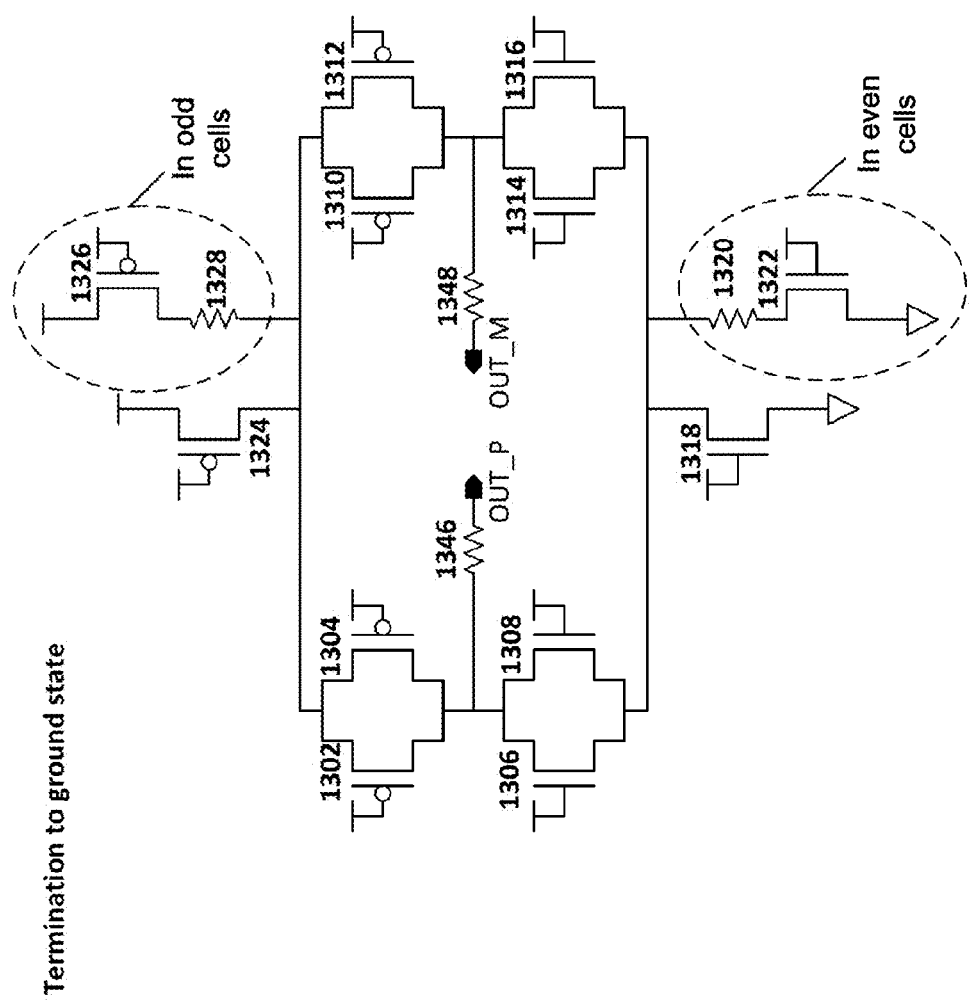
FIG. 12 illustrates a circuit depicting a driver segment configured to a termination to ground state.

FIG. 12 illustrates a circuit 1300 depicting a driver segment configured to a termination to ground state. PMOS 1302, 1304, 1310, 1312, 1324 and 1326 are analogous to PMOS 302, 304, 310, 312, 324 and 326 in FIG. 3, respectively. NMOS 1306, 1308, 1314, 1316, 1318 and 1322 are analogous to NMOS 306, 308, 314, 316, 318 and 322, respectively. Resistors 1320 and 1328 are analogous to resistors 320 and 328, respectively. Resistors 1346 and 1348 are analogous to resistors 346 and 348, respectively.

To set the driver segment to the circuit 1300, the controller issues a command to enter state 520. The circuit 1300 is a simplified equivalent circuit emphasizing the active components in driver segment 300 during the termination to ground state while omitting pre-driver circuits for the sake of clarity. During the configuration of the termination to ground state, control signals from the controller activate NMOS 1306, NMOS 1308, NMOS 1314, NMOS 1316, NMOS 1318, and NMOS 1322. Accordingly, a resistive path to ground is established from both OUT_P and OUT_M. Based on the connections established by the NMOS transistors on each of the P side and the M side, the OUT_P and OUT_M pins are pulled to ground with a strength inversely proportional to the path's impedance. When all active segments of the driver are configured to this state, a termination to ground is achieved; when only a sub-set of the active segments is set in this state, a new form of margining is established where the transmitter output common-mode is pulled lower and deviates from the expected $V_{DD}/2$.

Figure 13:
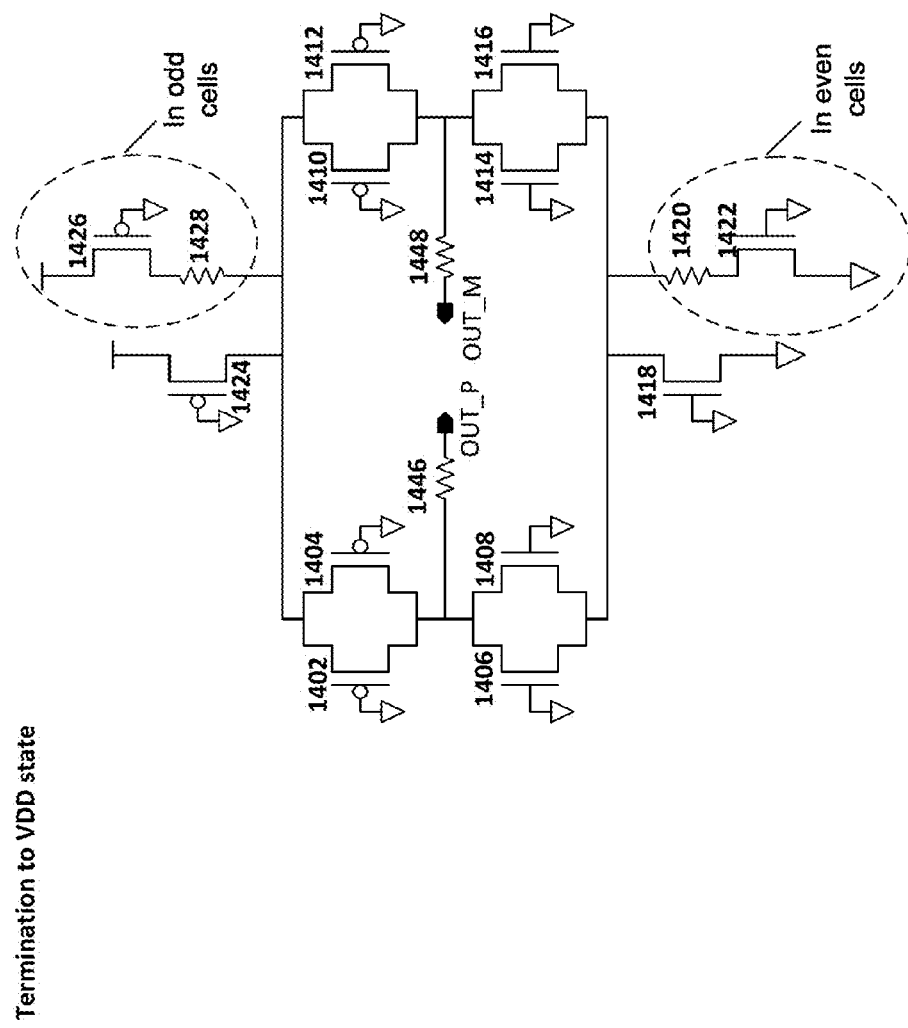
FIG. 13 illustrates a circuit depicting a driver segment configured to a termination to $V_{DD}$ state.

FIG. 13 illustrates a circuit 1400 depicting a driver segment configured to a termination to $V_{DD}$ state. PMOS 1402, 1404, 1410, 1412, 1424 and 1426 are analogous to PMOS 302, 304, 310, 312, 324 and 326 in FIG. 3, respectively. NMOS 1406, 1408, 1414, 1416, 1418 and 1422 are analogous to NMOS 306, 308, 314, 316, 318 and 322, respectively. Resistors 1420 and 1428 are analogous to resistors 320 and 328, respectively. Resistors 1446 and 1448 are analogous to resistors 346 and 348, respectively.

To set the driver segment to the circuit 1400, the controller issues a command to enter state 522. The circuit 1400 is a simplified equivalent circuit emphasizing the active components in driver segment 300 during the termination to $V_{DD}$ state while omitting pre-driver circuits for the sake of clarity. During the configuration of the termination to $V_{DD}$ state, control signals from the controller activate PMOS 1402, PMOS 1404, PMOS 1410, PMOS 1412, PMOS 1424, and PMOS 1426. Accordingly, a resistive path to $V_{DD}$ is established from both OUT_P and OUT_M. Based on the connections established by the PMOS transistors on each of the P side and the M side, the OUT_P and OUT_M pins are pulled to $V_{DD}$ with a strength inversely proportional to the path's impedance. When all active segments of the driver are configured to this state, a termination to $V_{DD}$ is achieved; when only a sub-set of the active segments is set in this state, a new form of margining is established where the transmitter output common-mode is pulled higher and deviates from the expected $V_{DD}/2$.

Figure 14A:
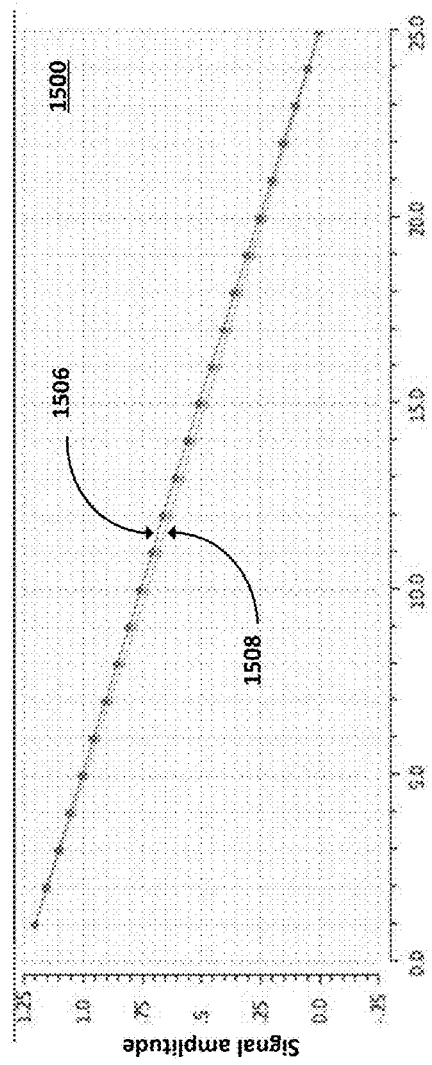
FIG. 14A illustrates a chart depicting signal amplitude achievable by switching driver segments to low-power margining versus conventional margining.

FIG. 14A illustrates a chart 1500 depicting signal amplitude achievable by progressively switching segments of the Tx driver output stage to low-power margining versus conventional margining. The x-axis of chart 1500 corresponds to the number of segment pairs set to a margining state, and the y-axis corresponds to signal amplitude. Trajectory 1506 indicates the relationship between signal amplitude and the number of segment pairs in a Tx output stage set to the classical margining state. Trajectory 1508 indicates the relationship between signal amplitude and the number of segment pairs in a Tx output stage set to the low-power margining state. A comparison of trajectory 1506 and trajectory 1508 indicates that classical margining and low-power margining transmit a signal of approximately the same signal amplitude.

Figure 14B:
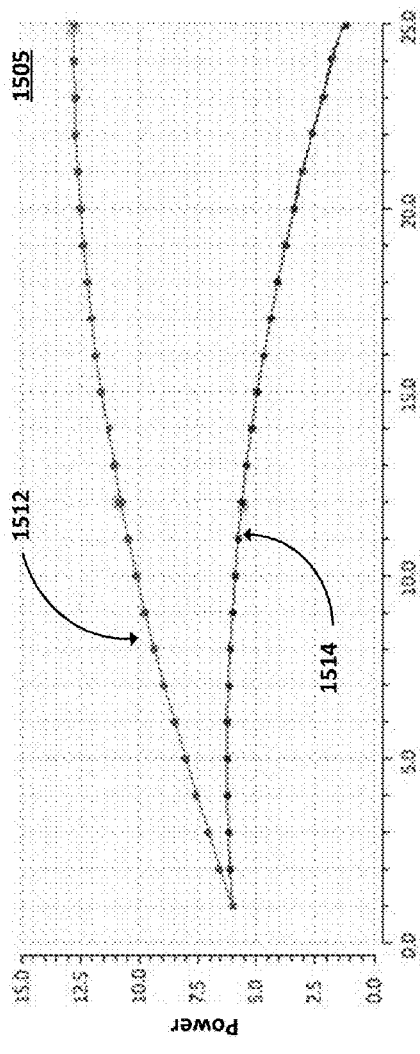
FIG. 14B illustrates a chart depicting power expended by switching driver segments to low-power margining versus conventional margining.

FIG. 14B illustrates a chart 1505 depicting power expended by switching segments of the Tx driver output stage to low-power margining versus conventional margining. As with chart 1500, the x-axis corresponds to the number of available segment pairs set to a margining state. The y-axis corresponds to the total power expended in the Tx output stage. Trajectory 1512 indicates the relationship between power expended and the number of segment pairs in a Tx output stage set to the classical margining state. Trajectory 1514 indicates the relationship between power expended and the number of segment pairs in a Tx output stage set to the low-power margining mode. A comparison of trajectory 1512 and trajectory 1514 indicates that low-power margining mode results in significant power savings compared to classical margining mode. Considering that the two modes have approximately the same resulting signal amplitude, the low-power margining mode clearly provides power savings at equivalent signal integrity relative to the classical margining mode.

Figure 15:
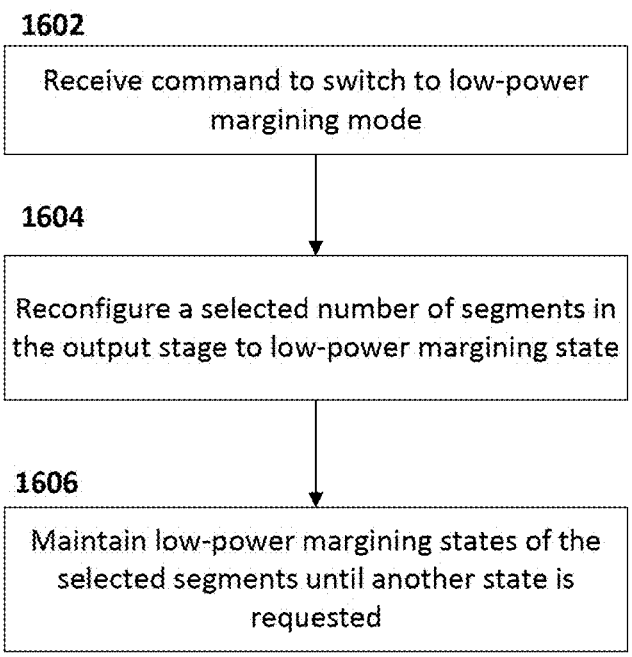
FIG. 15 illustrates a method to switch an output driver to a low-power margining mode.

FIG. 15 illustrates a method 1600 to switch an output driver to a low-power margining mode. The method 1600 may be performed using the circuits in the previously described embodiments. At step 1602, selected segments in the output stage of a Tx driver receive a command to enter the low-power margining state 510 or 512, e.g., via appropriate control signals to the individual segments.

At 1604, the selected segments are individually reconfigured to the low-power margining state shown in FIG. 9. As mentioned earlier, the segments may be configured in pairs.

At step 1606, the selected segments maintain the low-power margining state until another state is requested for those segments, e.g., a different one of the driving states in FIG. 5. A subsequent change in state could occur while still in the low-power margining mode (e.g., configuring more or fewer segments for margining) or in connection with a switch to a different operating mode.

In the foregoing Description of Exemplary Embodiments, various features are grouped together in a single embodiment for purposes of streamlining the disclosure. This method of disclosure is not to be interpreted as reflecting an intention that the claims require more features than are expressly recited in each claim. Rather, as the following claims reflect, inventive aspects lie in less than all features of a single foregoing disclosed embodiment. Thus, the following claims are hereby incorporated into this Description of Exemplary Embodiments, with each claim standing on its own as a separate embodiment of the invention.

Moreover, it will be apparent to those skilled in the art from consideration of the specification and practice of the present disclosure that various modifications and variations can be made to the disclosed systems and methods without departing from the scope of the disclosure, as claimed. Thus, it is intended that the specification and examples be considered as exemplary only, with a true scope of the present disclosure being indicated by the following claims and their equivalents.

What is claimed is:

1. A method for power efficient margining, the method comprising:
    in an output driver including segments that are each connected to a positive driver output and a negative driver output, reconfiguring some of the segments to a first margining state, wherein:
        each segment can be configured independently to different states, including the first margining state and a transmitting state, by activating corresponding combinations of transistors in the segment;
        when a segment is in the transmitting state, the transistors in the segment transmit data by forming a first current path between the positive driver output and one of a positive supply rail and a ground rail, and by forming a second current path between the negative driver output and an opposite one of the positive supply rail and the ground rail, wherein the first and second current paths are formed dynamically in response to input of the data; and
        when a segment is in the first margining state, the transistors in the segment are statically configured to form different current paths to the driver outputs than in the transmitting state, such that the segment contributes substantially a same differential impedance between the driver outputs as would be contributed by the segment when in the transmitting state, while contributing a different common mode impedance than in the transmitting state, wherein the different current paths extend through transistors that transmit the data in the transmitting state.

2. The method of claim 1, further comprising:
    reconfiguring some of the segments to a second margining state in which a common mode impedance that would be contributed by the segment when in the transmitting state is maintained using separate current paths for the positive driver output and the negative driver output, wherein the separate current paths are unconnected in the segment.

3. The method of claim 1, wherein when a segment is in the first margining state, lower current paths than the first current path and the second current path establish connections between the driver outputs and the rails, and wherein each segment that is in the first margining state has at least one of the lower current paths.

4. The method of claim 3, wherein each of the lower current paths includes a transistor in series with a resistor, and wherein the first and second current paths each include an additional transistor connected in parallel with the transistor that is in series with the resistor in one of the lower current paths.

5. The method of claim 3, wherein each of the lower current paths induces a reduced gate-source voltage in a first transistor along the lower current path compared to a gate-source voltage available to the first transistor when the segment is in the transmitting state, and wherein the reduced gate-source voltage is sufficient to activate the first transistor.

6. The method of claim 5, further comprising:
    compensating for an increase in an impedance of the first transistor caused by the reduced gate-source voltage, by activating an additional transistor connected in parallel with the first transistor.

7. The method of claim 3, further comprising:
    reconfiguring at least some of the segments to one of a high-impedance state, a floating common mode state, a termination to ground state, and a termination to the positive supply rail state, by selectively activating or deactivating the transistors that transmit the data in the transmitting state, the first and second current paths used in the transmitting state, and the different current paths used in the first margining state.

8. The method of claim 1, wherein when in the transmitting state, a segment transmits data of a current unit interval.

9. The method of claim 1, wherein when in the transmitting state, a segment transmits data of a preceding or a subsequent unit interval.

10. A controller for an output driver of a transmitter, the controller comprising:
    a decoder that configures segments in the output driver independently to different states, including a first margining state and a transmitting state, by activating corresponding combinations of transistors in the segments, wherein:
        the segments are each connected to a positive driver output and a negative driver output;
        when a segment is in the transmitting state, the transistors in the segment transmit data by establishing a first current path between the positive driver output and one of a positive supply rail and a ground rail, and by establishing a second current path between the negative driver output and an opposite one of the positive supply rail and the ground rail, wherein the first and second current paths are formed dynamically in response to input of the data; and
        when a segment is in the first margining state, the transistors in the segment are statically configured to form different current paths to the driver outputs than in the transmitting state, such that the segment contributes substantially a same differential impedance between the driver outputs as would be contributed by the segment when in the transmitting state, while contributing a different common mode impedance than in the transmitting state, wherein the different current paths extend through transistors that transmit the data in the transmitting state.

11. The controller of claim 10, wherein the decoder reconfigures some of the segments to a second margining state in which a common mode impedance that would be contributed by the segment when in the transmitting state is maintained using separate current paths for the positive driver output and the negative driver output, and wherein the separate current paths are unconnected in the segment.

12. The controller of claim 10, wherein when a segment is in the first margining state, lower current paths than the first current path and the second current path establish connections between the driver outputs and the rails, and wherein each segment that is in the first margining state has at least one of the lower current paths.

13. The controller of claim 12, wherein each of the lower current paths includes a transistor in series with a resistor, and wherein the first and second current paths each include an additional transistor connected in parallel with the transistor that is in series with the resistor in one of the lower current paths.

14. The controller of claim 12, wherein each of the lower current paths induces a reduced gate-source voltage in a first transistor along the lower current path compared to a gate-source voltage available to the first transistor when the segment is in the transmitting state, and wherein the reduced gate-source voltage is sufficient to activate the first transistor.

15. The controller of claim 14, wherein the controller compensates for an increase in an impedance of the first transistor caused by the reduced gate-source voltage, by activating an additional transistor connected in parallel with the first transistor.

16. An output driver of a transmitter, the output driver comprising:
   a plurality of segments that are each connected to a positive driver output and a negative driver output, wherein:
      each segment can be configured independently to different states, including a first margining state and a transmitting state, by activating corresponding combinations of transistors in the segment;
      when a segment is in the transmitting state, the transistors in the segment transmit data by establishing a first current path between the positive driver output and one of a positive supply rail and a ground rail, and by establishing a second current path between the negative driver output and an opposite one of the positive supply rail and the ground rail, wherein the first and second current paths are formed dynamically in response to input of the data; and
      when a segment is in the first margining state, the transistors in the segment are statically configured to form different current paths to the driver outputs than in the transmitting state, such that the segment contributes substantially a same differential impedance between the driver outputs as would be contributed by the segment when in the transmitting state, while contributing a different common mode impedance than in the transmitting state, wherein the different current paths extend through transistors that transmit the data in the transmitting state.

17. The output driver of claim 16, wherein each segment can be configured to a second margining state in which the common mode impedance that would be contributed by the segment when in the transmitting state is maintained using separate current paths for the positive driver output and the negative driver output, and wherein the separate current paths are unconnected in the segment.

18. The output driver of claim 16, wherein when a segment is in the first margining state, lower current paths than the first current path and the second current path establish connections between the driver outputs and the rails, and wherein each segment that is in the first margining state has at least one of the lower current paths.

19. The output driver of claim 18, wherein each of the lower current paths includes a transistor in series with a resistor, and wherein the first and second current paths each include an additional transistor connected in parallel with the transistor that is in series with the resistor in one of the lower current paths.

20. The output driver of claim 18, wherein each of the lower current paths induces a reduced gate-source voltage in a first transistor along the lower current path compared to a gate-source voltage available to the first transistor when the segment is in the transmitting state, and wherein the reduced gate-source voltage is sufficient to activate the first transistor.

* * * * *